US008026200B2

(12) United States Patent
Cooper et al.

(10) Patent No.: US 8,026,200 B2
(45) Date of Patent: Sep. 27, 2011

(54) LOW PH MIXTURES FOR THE REMOVAL OF HIGH DENSITY IMPLANTED RESIST

(75) Inventors: Emanuel Cooper, Scarsdale, NY (US); Julie Cissell, Danbury, CT (US); Renjie Zhou, Plainsboro, NJ (US); Michael B. Korzenski, Danbury, CT (US); George G. Totir, Newtown, CT (US); Mahmoud Khojasteh, Poughkeepsie, NY (US)

(73) Assignees: Advanced Technology Materials, Inc., Danbury, CT (US); International Business Machines Corp., Armonk, NY (US)

( * ) Notice: Subject to any disclaimer, the term of this patent is extended or adjusted under 35 U.S.C. 154(b) by 97 days.

(21) Appl. No.: 12/434,321

(22) Filed: May 1, 2009

(65) Prior Publication Data

US 2009/0281016 A1    Nov. 12, 2009

Related U.S. Application Data

(60) Provisional application No. 61/049,600, filed on May 1, 2008, provisional application No. 61/054,798, filed on May 20, 2008, provisional application No. 61/093,954, filed on Sep. 3, 2008.

(51) Int. Cl.
*H01L 21/02* (2006.01)
(52) U.S. Cl. .......................... 510/175; 510/176; 134/1.3
(58) Field of Classification Search .................. 510/175, 510/176; 134/1.3
See application file for complete search history.

(56) References Cited

U.S. PATENT DOCUMENTS

| | | | |
|---|---|---|---|
| 4,215,005 A | | 7/1980 | Vander Mey |
| 4,419,183 A | | 12/1983 | Gulla et al. |
| 5,681,487 A | * | 10/1997 | Seki et al. .................. 216/94 |
| 5,861,064 A | | 1/1999 | Oikari et al. |
| 5,989,443 A | | 11/1999 | Covert et al. |
| 6,032,682 A | * | 3/2000 | Verhaverbeke .............. 134/1.3 |
| 6,383,723 B1 | | 5/2002 | Iyer et al. |
| 6,610,791 B2 | | 8/2003 | Tada et al. |
| 7,202,165 B2 | | 4/2007 | Jo |
| 7,390,615 B2 | | 6/2008 | Greco |
| 7,399,365 B2 | | 7/2008 | Aoyama et al. |
| 7,419,911 B2 | * | 9/2008 | Chelle et al. .................. 438/692 |
| 7,422,700 B1 | | 9/2008 | Hardikar |
| 2003/0051740 A1 | * | 3/2003 | Chao et al. .................. 134/3 |
| 2004/0159335 A1 | | 8/2004 | Montierth et al. |
| 2005/0014667 A1 | | 1/2005 | Aoyama et al. |
| 2005/0176603 A1 | | 8/2005 | Hsu |
| 2005/0178742 A1 | * | 8/2005 | Chelle et al. .................. 216/88 |
| 2006/0128160 A1 | | 6/2006 | Yoo |
| 2006/0183248 A1 | | 8/2006 | Small |
| 2006/0183654 A1 | | 8/2006 | Small |
| 2007/0158302 A1 | | 7/2007 | Gilton |
| 2007/0227556 A1 | * | 10/2007 | Bergman .................. 134/3 |
| 2007/0298607 A1 | | 12/2007 | Andryushchenko et al. |
| 2008/0041813 A1 | | 2/2008 | Oladegi et al. |
| 2008/0047584 A1 | * | 2/2008 | Britten et al. .................. 134/3 |
| 2008/0053956 A1 | | 3/2008 | Gomez et al. |
| 2008/0115422 A1 | | 5/2008 | Suzuki et al. |
| 2008/0119056 A1 | | 5/2008 | Bailey et al. |
| 2008/0173473 A1 | | 7/2008 | Hirose et al. |
| 2008/0179709 A1 | | 7/2008 | Greco |
| 2008/0295874 A1 | | 12/2008 | Tang et al. |
| 2009/0001051 A1 | | 1/2009 | Lee et al. |
| 2009/0099051 A1 | | 4/2009 | Aoyama et al. |
| 2010/0136794 A1 | * | 6/2010 | Ferstl et al. .................. 438/745 |

FOREIGN PATENT DOCUMENTS

| | | |
|---|---|---|
| KR | 1020030066451 A | 9/2003 |
| KR | 1020040049119 A | 11/2004 |
| KR | 1020080023346 A | 3/2008 |
| WO | 2007072727 A1 | 6/2007 |
| WO | 2009026324 A2 | 2/2009 |

OTHER PUBLICATIONS

Takahashi, H., Plasma-less photoresist stripping, ECS Transactions, 2007, vol. 11, Issue 2.
International Searching Authority, International Search Report and Written Opinion, PCT/US2009/042480, May 1, 2009.

* cited by examiner

*Primary Examiner* — Gregory E Webb
(74) *Attorney, Agent, or Firm* — Rosa Yaghmour; Tristan A. Fuierer; Moore & Van Allen, PLLC

(57) ABSTRACT

A method and low pH compositions for removing bulk and/or hardened photoresist material from microelectronic devices have been developed. The low pH compositions include at least one mineral acid and at least one oxidizing agent. The low pH compositions effectively remove the hardened photoresist material while not damaging the underlying silicon-containing layer(s).

26 Claims, No Drawings

LOW PH MIXTURES FOR THE REMOVAL OF HIGH DENSITY IMPLANTED RESIST

CROSS-REFERENCE TO RELATED APPLICATIONS

This application is filed according to 35 U.S.C. §111(a) and claims priority to U.S. Provisional Patent Application No. 61/049,600, filed on May 1, 2008 in the name of Emanuel Cooper et al., U.S. Provisional Patent Application No. 61/054,798, filed on May 20, 2008 in the name of Renjie Zhou et al., and U.S. Provisional Patent Application No. 61/093,954, filed on Sep. 3, 2008 in the name of Emanuel Cooper et al., all of which are incorporated by reference in their respective entirety herein.

FIELD

The present invention relates generally to low pH compositions useful for the removal of bulk and hardened photoresist from the surface of microelectronic devices, and methods of using said compositions for removal of same.

DESCRIPTION OF THE RELATED ART

As semiconductor devices have become more integrated and miniaturized, ion implantation has been extensively employed during front-end-of-line (FEOL) processing to accurately control impurity distributions in the microelectronic device and to add dopant atoms, e.g., As, B and P, to the exposed device layers. The concentration and depth of the dopant impurity is controlled by varying the dose of the dopant, the acceleration energy, and the ion current. Prior to subsequent processing, the ion-implanted photoresist layer must be removed.

Unfortunately, when high doses of ions (e.g., doses greater than about $1 \times 10^{15}$ atoms $cm^{-2}$), at low (5-10 keV), medium (20 keV) and high (40-60 keV) implant energy, are implanted in the desired layer, they are also implanted throughout the photoresist layer, particularly the exposed surface of the photoresist, which becomes physically and chemically rigid. The rigid ion-implanted photoresist layer, also referred to as the carbonized region or "crust," has proven difficult to remove.

Various processes have been used in the past for the removal of said hardened photoresist including, but not limited to, wet chemical etching processes, e.g., in a mixed solution of sulphuric acid and hydrogen peroxide (i.e., a Piranha solution or SPM), and dry plasma etching processes, e.g., in an oxygen plasma ashing process. Presently, the removal of the ion-implanted photoresist and other contaminants is usually performed by a plasma etch method followed by a multi-step wet strip process, typically using aqueous-based etchant formulations to remove photoresist, post-etch residue and other contaminants. Wet strip treatments in the art generally involve the use of strong acids, bases, solvents, and oxidizing agents. Disadvantageously, however, wet strip treatments also etch the underlying silicon-containing layers, such as the substrate and gate oxide, and/or increase the gate oxide thickness. Furthermore, solutions such as Piranha require a high local wafer temperature, are hard to control and in the absence of an ashing step are not very effective at the highest implant doses. However the combination of an ashing step and Piranha wet strip tends to cause more substrate damage than each step by itself.

As the feature sizes continue to decrease, satisfying the aforementioned removal requirements becomes significantly more challenging using the aqueous-based etchant formulations of the prior art. Water has a high surface tension which limits or prevents access to the smaller image nodes with high aspect ratios, and therefore, removing the residues in the crevices or grooves becomes more difficult. In addition, aqueous-based etchant formulations often leave previously dissolved solutes behind in the trenches or vias upon evaporative drying, which inhibit conduction and reduce device yield. Furthermore, underlying porous low-k dielectric materials do not have sufficient mechanical strength to withstand the capillary stress of high surface tension liquids such as water, resulting in pattern collapse of the structures. Aqueous etchant formulations can also strongly alter important material properties of the low-k materials, including dielectric constant, mechanical strength, moisture uptake, coefficient of thermal expansion, and adhesion to different substrates.

Therefore, it would be a significant advance in the art to provide a composition that overcomes the deficiencies of the prior art relating to the removal of bulk and hardened photoresist from microelectronic devices. The composition can effectively remove bulk and hardened photoresist in a one-step or multi-step process, alternatively with a plasma etch step, without substantially over-etching the underlying silicon-containing layer(s).

SUMMARY

The present invention relates generally to a low pH composition that includes at least one mineral acid and at least one oxidizing agent, wherein the composition is useful for the removal of bulk and hardened photoresist from the surface of microelectronic devices.

In one aspect, a low pH composition is described, said composition comprising at least one mineral acid and at least one oxidizing agent, wherein the composition is suitable for removing bulk and/or hardened photoresist material from a microelectronic device having said photoresist material thereon. Preferably, the mineral acid comprises sulfuric acid, even more preferably concentrated sulfuric acid.

In another aspect, a low pH composition is described, said composition comprising at least one mineral acid and at least two oxidizing agents, wherein the composition is suitable for removing bulk and/or hardened photoresist material from a microelectronic device having said photoresist material thereon. Preferably, the mineral acid comprises sulfuric acid, even more preferably concentrated sulfuric acid.

In still another aspect, a low pH composition is described, said composition comprising at least one mineral acid, at least one iodine-containing oxidizing agent and at least one metal ion-containing oxidizing agent, wherein the composition is suitable for removing bulk and/or hardened photoresist material from a microelectronic device having said photoresist material thereon. Preferably, the mineral acid comprises sulfuric acid, even more preferably concentrated sulfuric acid.

Another aspect relates to a low pH composition comprising at least one mineral acid and at least one iodine-containing oxidizing agent, wherein the composition is suitable for removing bulk and/or hardened photoresist material from a microelectronic device having said photoresist material thereon. Preferably, the mineral acid comprises sulfuric acid, even more preferably concentrated sulfuric acid.

Still another aspect relates to a low pH composition comprising at least one mineral acid and at least one metal ion-containing oxidizing agent, wherein the composition is suitable for removing bulk and/or hardened photoresist material from a microelectronic device having said photoresist material thereon. Preferably, the mineral acid comprises sulfuric acid, even more preferably concentrated sulfuric acid. Preferably, the metal ion-containing oxidizing agent comprises a permanganate species.

In yet another aspect, a low pH composition is described, said composition comprising at least one mineral acid, at least one persulfate compound and at least one peroxide compound, wherein the composition is suitable for removing bulk and/or hardened photoresist material from a microelectronic device having said photoresist material thereon. Preferably, the mineral acid comprises sulfuric acid, even more preferably concentrated sulfuric acid.

Other aspects, features and advantages will be more fully apparent from the ensuing disclosure and appended claims.

DETAILED DESCRIPTION AND PREFERRED EMBODIMENTS THEREOF

The present invention is generally based on the discovery of low pH compositions, specifically mineral acid-containing compositions, which are highly efficacious for the removal of bulk and hardened photoresist from the surface of microelectronic devices. More specifically, the low pH compositions are particularly useful for the removal of high dose ion-implanted photoresist from the surface of a microelectronic device having same thereon.

For ease of reference, "microelectronic device" corresponds to semiconductor substrates, flat panel displays, phase change memory devices, solar panels and photovoltaics, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

"Bulk photoresist," as used herein, corresponds to the non-carbonized photoresist on the microelectronic device surface, specifically adjacent to and below the hardened photoresist crust.

"Hardened photoresist" as used herein includes, but is not limited to: photoresist that has been plasma etched, e.g., during back-end-of-line (BEOL) dual-damascene processing of integrated circuits; ion implanted, e.g., during front-end-of-line (FEOL) processing to implant dopant species in the appropriate layers of the semiconductor wafer; and/or any other methodology whereby a carbonized or highly cross-linked crust forms on the exposed surface of the bulk photoresist. Doping species include, but are not limited to, boron, arsenic, boron difluoride, indium, antimony, germanium, carbon, and/or phosphorous ions.

As used herein, "underlying silicon-containing" layer corresponds to the layer(s) immediately below the bulk and/or the hardened photoresist including: silicon; silicon oxide, including gate oxides (e.g., thermally or chemically grown $SiO_2$) and TEOS; silicon nitride; and low-k dielectric materials. As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

"Substantially devoid" is defined herein as less than 2 wt. %, preferably less than 1 wt. %, more preferably less than 0.5 wt. %, and most preferably less than 0.1 wt. %.

As defined herein, "substantially over-etching" corresponds to greater than about 10% removal, more preferably greater than about 5% removal, and most preferably greater than about 2% removal, of the adjacent underlying silicon-containing layer(s) following contact, according to the process described herein, of the low pH compositions described herein with the microelectronic device having said underlying layer(s). In other words, most preferably no more than 2% of the underlying silicon-containing layer(s) are etched using the compositions described herein for the prescribed times at the prescribed temperatures.

As used herein, "about" is intended to correspond to ±5% of the stated value.

As used herein, "suitability" for removing bulk and hardened photoresist material from a microelectronic device having said photoresist material thereon, corresponds to at least partial removal of said photoresist material from the microelectronic device. Preferably, at least 90% of the photoresist material is removed from the microelectronic device using the compositions described herein, more preferably, at least 95%, and most preferably at least 99% of the photoresist material, is removed.

As used herein, "high dose" ion-implanted photoresist corresponds to ion doses greater than about $1 \times 10^{15}$ atoms $cm^{-2}$. It should be appreciated that the compositions described herein are also expected to remove less than high dose ion-implanted photoresist from the surface of a microelectronic device having same thereon.

Compositions may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.01 weight percent, based on the total weight of the composition in which such components are employed.

In general, the compositions described herein include at least one mineral acid and at least one oxidizing agent, wherein the composition is useful for the removal of bulk and hardened photoresist from the surface of a microelectronic device. Preferably, the at least one oxidizing agent is soluble in the at least one mineral acid and is reasonably stable under the process conditions.

In one aspect, a composition comprising, consisting of, or consisting essentially of at least one mineral acid and at least one oxidizing agent is described, wherein the composition is useful for the removal of bulk and hardened photoresist from a microelectronic device having same thereon. In one embodiment of the first aspect, a composition comprising, consisting of, or consisting essentially of at least one mineral acid and at least one iodine-containing oxidizing agent is described. In another embodiment of the first aspect a composition comprising, consisting of, or consisting essentially of at least one mineral acid, at least one iodine-containing oxidizing agent, and at least one metal ion-containing oxidizing agent is described. In still another embodiment of the first aspect a composition comprising, consisting of, or consisting essentially of at least one mineral acid and at least one metal ion-containing oxidizing agent is described. In yet another embodiment of the first aspect, a composition comprising, consisting of, or consisting essentially of at least one mineral acid, at least one iodine-containing oxidizing agent, and added water is described. In still another embodiment of the first aspect, a composition comprising, consisting of, or consisting essentially of at least one mineral acid, at least one iodine-containing oxidizing agent, at least one metal ion-containing oxidizing agent, and added water is described. In another embodiment of the first aspect, a composition comprising, consisting of, or consisting essentially of at least one mineral acid, at least one metal ion-containing oxidizing agent, and added water is described. In general, the specific proportions and amounts of components, in relation to each other, may be suitably varied to provide the desired removal action of the composition of the first aspect for the bulk and hardened photoresist and/or processing equipment, as readily determinable within the skill of the art without undue effort.

Mineral acids useful for the composition described herein include, but are not limited to, sulfuric acid, methanesulfonic acid, trifluoromethane sulfonic acid, perchloric acid, trifluoroacetic acid, nitric acid, pyrosulfuric acid ($H_2S_2O_7$), pyrophosphoric acid, polymetaphosphoric acid, phosphoric acid, and combinations thereof. Most preferably, the mineral acid comprises sulfuric acid, preferably concentrated sulfuric acid, which commercially is 95% to 98% $H_2SO_4$. Although less favored, the sulfuric acid may be diluted such that the concentration of $H_2SO_4$ in the composition is in a range from about 50% to about 95%. In another embodiment, the at least one mineral acid comprises concentrated sulfuric acid and concentrated phosphoric acid.

Iodine-containing oxidizing agents include, but are not limited to, periodic acid, including metaperiodic acid ($HIO_4$) and orthoperiodic (or paraperiodic) acid ($H_5IO_6$), salts of periodic acid such as sodium periodate, potassium periodate, ammonium and calcium periodate, iodic acid and salts thereof (e.g., such as sodium iodate, potassium iodate and calcium iodate), iodine, and combinations thereof. Preferably, the iodine-containing oxidizing agent includes periodic acid, most preferably in the form of orthoperiodic (or paraperiodic) acid ($H_5IO_6$). In another embodiment, the periodic acid is generated in situ by oxidation of iodine or an iodine compound (e.g., using electrochemical means or a strong oxidant such as ozone or persulfate).

Metal ion-containing oxidizing agents contemplated include, but are not limited to, potassium permanganate, cesium permanganate, sodium permanganate, ammonium permanganate, tertamethylammonium permanganate, tetrabutylammonium permanganate, permanganic acid and combinations thereof. Alternatively, or in addition to the permanganates, chromates, dichromates, and chromium (VI) oxide may be used but are not preferred. Preferably, the metal-ion containing oxidizing agent includes potassium or cesium permanganate.

It is understood that concentrated $H_2SO_4$ has a small amount (typically 2-5%) of water, however, preferably not much additional water is added to the compositions of the first aspect described herein. The compositions of the first aspect preferably include less than about 15 wt % total water, more preferably less than about 10 wt %, and most preferably less than about 5 wt %, based on the total weight of the composition. In another embodiment, the compositions of the first aspect are substantially devoid of added water. Furthermore, the compositions of the first aspect described herein are preferably substantially devoid of abrasive material, hydrogen peroxide, hydrofluoric acid, fluoride ions, cations such as imidazolium, pyridinium, pyrrolidinium, ammonium and phosphonium, polymeric polishing accelerating agents having a hydrocarbon backbone, and combinations thereof.

The amount of each component in the composition of the first aspect comprising, consisting of, or consisting essentially of at least one mineral acid and at least one iodine-containing oxidizing agent, based on the total weight of the composition, is:

|  | Amount (wt %) | Preffered Amount (wt %) |
|---|---|---|
| mineral acid(s) | about 80 to about 99.9 wt % | about 85 to about 99 wt % |
| iodine-containing oxidizing agent(s) | about 0.1 to about 20 wt % | about 1 to about 15 wt % |

The mineral acid is the solvent in the compositions of the first aspect described herein. This embodiment is substantially devoid of added water.

The amount of each component in the composition of the first aspect comprising, consisting of, or consisting essentially of at least one mineral acid, at least one iodine-containing oxidizing agent, and at least one metal ion-containing oxidizing agent, based on the total weight of the composition, is:

|  | Amount (wt %) | Preferred Amount (wt %) |
|---|---|---|
| concentrated sulfuric acid(s) | about 80 to about 99.9 wt % | about 85 to about 99 wt % |
| iodine-containing oxidizing agent(s) | about 0.1 to about 20 wt % | about 1 to about 15 wt % |
| metal ion-containing oxidizing agent(s) | 0.01 to about 1000 ppm | 50 to about 500 ppm |

Again, the mineral acid is the solvent in the compositions of the first aspect described herein. This embodiment is substantially devoid of added water.

The amount of each component in the composition of the first aspect comprising, consisting of, or consisting essentially of at least one mineral acid and at least one metal ion-containing oxidizing agent, based on the total weight of the composition, is:

|  | Amount (wt %) |
|---|---|
| concentrated sulfuric acid(s) | about 95 to about 99.99 wt % |
| metal ion-containing oxidizing agent(s) | about 0.01 to about 5 wt % |

Again, the mineral acid is the solvent in the compositions of the first aspect described herein. This embodiment is substantially devoid of added water.

The amount of each component in the composition of the first aspect comprising, consisting of, or consisting essentially of at least one mineral acid, at least one iodine-containing oxidizing agent, and added water, based on the total weight of the composition, is:

|  | Amount (wt %) | Preffered Amount (wt %) |
|---|---|---|
| mineral acid(s) | about 65 to about 99.89 wt % | about 80 to about 98.99 wt % |
| iodine-containing oxidizing agent(s) | about 0.1 to about 20 wt % | about 1 to about 15 wt % |
| added water | about 0.01 to about 15 wt % | about 0.01 to about 5 wt % |

The amount of each component in the composition of the first aspect comprising, consisting of, or consisting essentially of at least one mineral acid, at least one iodine-containing oxidizing agent, at least one metal ion-containing oxidizing agent, and added water, based on the total weight of the composition, is:

|  | Amount (wt %) | Preferred Amount (wt %) |
|---|---|---|
| concentrated sulfuric acid(s) | about 65 to about 99.98 wt % | about 80 to about 98.99 wt % |
| iodine-containing oxidizing agent(s) | about 0.1 to about 20 wt % | about 1 to about 15 wt % |
| metal ion-containing oxidizing agent(s) | 0.01 to about 1000 ppm | 50 to about 500 ppm |
| added water | about 0.01 to about 15 wt % | about 0.01 to about 5 wt % |

The amount of each component in the composition of the first aspect comprising, consisting of, or consisting essentially of at least one mineral acid, at least one metal ion-containing oxidizing agent, and added water, based on the total weight of the composition, is:

|  | Amount (wt %) |
|---|---|
| concentrated sulfuric acid(s) | about 90 to about 99.98 wt % |
| metal ion-containing oxidizing agent(s) | 0.01 to about 5 wt % |
| added water | about 0.01 to about 5 wt % |

In a particularly preferred embodiment, the composition of the first aspect comprises, consists of, or consists essentially of concentrated $H_2SO_4$ and periodic acid. In another particularly preferred embodiment, the composition of the first aspect comprises, consists of, or consists essentially of concentrated $H_2SO_4$, periodic acid and potassium permanganate. In yet another particularly preferred embodiment, the composition of the first aspect comprises, consists of, or consists essentially of concentrated $H_2SO_4$, periodic acid and cesium permanganate. More preferably, the amount of periodic acid in each preferred embodiment is in a range from about 1 wt % to about 15 wt %, based on the total weight of the composition.

In still another particularly preferred embodiment, the composition of the first aspect comprises, consists of, or consists essentially of concentrated $H_2SO_4$ and potassium permanganate.

The compositions of the first aspect described herein have pH less than about 2, more preferably less than about 1. It is to be appreciated that the pH of the composition of the first aspect described herein may be less than zero, depending on the components used and the amount thereof.

To solve the problem of hydration of the sulfuric acid-based mixture in ambient air, or to accommodate water introduced with a component added in the form of aqueous solution (e.g. periodic acid), fuming sulfuric acid may be added to react with absorbed water according to the reaction:

$$H_2S_2O_7 + H_2O \rightarrow 2H_2SO_4$$

however, this addition is preferably performed to the hydrated solution just prior to or during use, because the small amount of water present in the concentrated sulfuric acid is necessary for the initial dissolution of periodic acid.

In another embodiment, the aforementioned compositions of the first aspect further include bulk and hardened photoresist material, wherein the bulk and hardened photoresist material may comprise boron, arsenic, boron difluoride, indium, antimony, germanium, carbon, and/or phosphorous ions. For example, the composition of the first aspect may include at least one mineral acid, at least one iodine-containing oxidizing agent, and bulk and hardened photoresist material. In another embodiment, the composition of the first aspect may include at least one mineral acid, at least one iodine-containing oxidizing agent, at least one metal ion-containing oxidizing agent, and bulk and hardened photoresist material. In yet another embodiment, the composition of the first aspect may include at least one mineral acid, at least one metal ion-containing oxidizing agent, and bulk and hardened photoresist material. In yet another embodiment, the composition of the first aspect may include at least one mineral acid, at least one iodine-containing oxidizing agent, added water, and bulk and hardened photoresist material. In still another embodiment, the composition of the first aspect may include at least one mineral acid, at least one iodine-containing oxidizing agent, at least one metal ion-containing oxidizing agent, added water, and bulk and hardened photoresist material. In another embodiment, the composition of the first aspect may include at least one mineral acid, at least one metal ion-containing oxidizing agent, added water, and bulk and hardened photoresist material. The photoresist material and implantation ions may be dissolved and/or suspended in the low pH composition.

The compositions are compatible with underlying silicon-containing materials on the microelectronic device.

The compositions of the first aspect may be readily formulated as single-package formulations or multi-part formulations that are mixed at or before the point of use, e.g., the individual parts of the multi-part formulation may be mixed at the tool, in a storage tank upstream of the tool, or in a shipping package that delivers the mixed formulation directly to the tool. For example, a single shipping package may include at least two separate containers or bladders that may be mixed together by a user at the fab and the mixed formulation may be delivered directly to the tool. One of the at least two containers or bladders may include the at least one iodine-containing oxidizing agent, which may be a solid, while another of the at least two containers may include at least one mineral acid and optionally at least one metal ion-containing oxidizing agent. In one embodiment, one of the at least two containers or bladders includes the at least one iodine-containing oxidizing agent, while a second of the at least two containers or bladders includes at least one mineral acid. In another embodiment, one of the at least two containers or bladders includes the at least one iodine-containing oxidizing agent, while a second of the at least two containers or bladders includes a mixture of at least one mineral acid and at least one metal ion-containing oxidizing agent. In yet another embodiment, one of the at least two containers or bladders includes the at least one iodine-containing oxidizing agent, while a second of the at least two containers or bladders includes at least one metal ion-containing oxidizing agent. In still another embodiment, one container or bladder includes the at least one iodine-containing oxidizing agent, a second container or bladder includes at least one mineral acid, and a third container or bladder includes at least one metal ion-containing oxidizing agent. In each case, if water is to be added, it can be added to one and/or both containers prior to leaving the manufacturer, may be added at the fab prior to use, or combinations of both, as readily determined by one skilled in the art. The shipping package and the internal containers or bladders of the package must be suitable for storing and shipping said composition components, for example, packaging provided by Advanced Technology Materials, Inc. (Danbury, Conn., USA).

Alternatively, a concentrate of the composition of the first aspect may be formulated and packaged in one container for shipping and for mixture with on-site mineral acid(s) prior to and/or during use, wherein said method of use is described herein. For example, the concentrate may comprise at least one iodine-containing oxidizing agent, water, and optionally at least one mineral acid, wherein the at least one iodine-containing oxidizing agent may have a concentration in a range from about 30 wt % to about 85 wt %, preferably about 51 wt % to about 85 wt %, and most preferably about 60 wt % to about 80 wt %, and wherein the amount of water is in a range from about 0.01 wt % to about 50 wt %, preferably about 1 wt % to about 30 wt %, and most preferably from about 10 wt % to about 25 wt %, based on the total weight of the concentrate. The amount of mineral acid in said concentrate, when present, may be in a range from about 0.01 wt % to about 45 wt %, based on the total weight of the concentrate. In a preferred embodiment, the concentrate for combination with on-site mineral acid(s) comprises, consists of, or consists essentially of at least one iodine-containing oxidizing agent, water, and optionally at least one mineral acid. In another embodiment, the concentrate for combination with on-site mineral acid(s) comprises, consists of, or consists essentially of at least one iodine-containing oxidizing agent, water, and at least one mineral acid. The ratio of concentrate to on-site mineral acid(s) is readily determined by one skilled in the art knowing how much iodine-containing oxidizing agent is desired in the low pH composition and how much mineral acid is present in the concentrate.

In the second aspect, the compositions described herein include at least one mineral acid and at least two oxidizing agents, wherein the composition is useful for the removal of bulk and hardened photoresist from the surface of a microelectronic device. In one embodiment, the compositions described herein include at least one persulfate compound and a mineral acid/peroxide mixture, wherein the composition is useful for the removal of bulk and hardened photoresist from the surface of a microelectronic device. Preferably, the at least one persulfate compound is soluble in the mineral acid/peroxide mixture and is reasonably stable under the process conditions. In another embodiment, the at least one persulfate is dissolved in at least one mineral acid and the persulfate/mineral acid mixture is dissolved in at least one peroxide compound.

Preferably, the composition of the second aspect comprises, consists of, or consists essentially of at least one mineral acid and at least two oxidizing agents, wherein the composition is useful for the removal of bulk and hardened photoresist from the surface of a microelectronic device. Alternatively, the composition of the second aspect comprises, consists of, or consists essentially of at least one persulfate compound, at least one mineral acid, and at least one peroxide compound, wherein the composition is useful for the removal of bulk and hardened photoresist from a microelectronic device having same thereon. In general, the specific proportions and amounts of components, in relation to each other, may be suitably varied to provide the desired removal action of the composition for the bulk and hardened photoresist and/or processing equipment, as readily determinable within the skill of the art without undue effort.

Persulfate compounds useful for the composition of the second aspect include, but are not limited to, peroxymonosulfate ($SO_5^{2-}$) and peroxydisulfate ($S_2O_8^{2-}$)-containing compounds such as ammonium peroxydisulfate, sodium peroxydisulfate, potassium peroxydisulfate, cesium peroxydisulfate, peroxydisulfuric acid, tetraalkylammonium peroxydisulfate where the alkyl groups may be the same as or different from one another and may be a $C_1$-$C_6$ alkyl (e.g., methyl, ethyl, propyl, butyl, pentyl or hexyl), an aryl (e.g., phenyl, benzyl, etc.), combinations thereof, as well as pyridinium and imidazolium peroxydisulfates. For example, tetraalkylammonium peroxydisulfates contemplated include, but are not limited to, tetramethyl ammonium peroxydisulfate, tetraethylammonium peroxydisulfate, and benzyltrimethylammonium peroxydisulfate. Most preferably, the persulfate compound(s) comprises ammonium peroxydisulfate, hereinafter referred to as "ammonium persulfate."

The mineral acids useful for the composition of the second aspect correspond to those described herein for the composition of the first aspect. In addition, the acid salt ammonium hydrogen sulfate may be a component of the composition of the second aspect.

Peroxide compounds useful for the composition of the second aspect include, but are not limited to, hydrogen peroxide, hydrogen peroxide-urea adduct, perborates such as ammonium perborate, percarbonates such as ammonium percarbonate, ozone, or combinations thereof. Most preferably, the peroxide compound comprises hydrogen peroxide having a concentration of about 20 wt % to about 50 wt %, based on the total weight of the hydrogen peroxide solution.

SPM compositions in the form of a sulfuric acid/aqueous hydrogen peroxide mixture may be used as the mineral acid and peroxide components for the composition of the second aspect. The SPM composition has a vol/vol ratio of sulfuric acid component to hydrogen peroxide component in a range from about 2:1 to about 10:1, more preferably about 2:1 to about 5:1, and most preferably about 3:1 to about 5:1. For example, in one embodiment, the SPM may include 4 parts concentrated sulfuric acid by volume and 1 part hydrogen peroxide (e.g., about 20 wt % to about 50 wt % hydrogen peroxide) by volume.

The compositions of the second aspect are substantially devoid of added water and organic solvents. It is understood that concentrated $H_2SO_4$ has a small amount of water and that commercially used hydrogen peroxide (e.g., about 20 wt % to about 50 wt %) contains water, however, preferably not much additional water is added to the composition of the second aspect described herein. Accordingly, the compositions of the second aspect include less than about 5 wt % added water, more preferably less than 3 wt % added water, and most preferably less than 2 wt % added water, based on the total weight of the composition. As defined herein, "added water" corresponds to water that the manufacturer or the user of the composition of the second aspect intentionally adds to the components of said composition for dilution or other purposes. Water that is present in the commercially purchased components (e.g., concentrated $H_2SO_4$ and/or hydrogen peroxide) is not considered "added water." Furthermore, the compositions of the second aspect are preferably substantially devoid of abrasive material, wetting agents (e.g., acetic acid, citric acid or another compound containing a carboxylic acid group), tungsten, copper ions or copper-containing residue, phosphate salts, and potassium sulfate. In one embodiment, the compositions of the second aspect include less than about 1 wt. % fluoride ions (e.g., tetramethylammonium fluoride, etc.), preferably less than about 0.5 wt. % fluoride ions, more preferably less than about 0.1 wt. % fluoride ions and in some embodiments, 0 wt. % fluoride ions, based on the total weight of the composition. Notably, the composition of the second aspect cannot include components that will result in the formation of a resinous material.

The amount of each component in the composition of the second aspect comprising, consisting of, or consisting essentially of at least one persulfate compound and sulfuric acid/peroxide mixture, based on the total weight of the composition, is:

|  | Amount (wt %) | Prefered Amount (wt %) |
|---|---|---|
| persulfate compound(s) | about 0.01 to about 20 wt % | about 5 to about 15 wt % |
| SPM | about 80 to about 99.99 wt % | about 85 to about 95 wt % |

The SPM composition preferably has a vol/vol ratio of sulfuric acid component to hydrogen peroxide component in a range from about 2:1 to about 10:1, more preferably about 2:1 to about 5:1, and most preferably about 3:1 to about 5:1.

In a particularly preferred embodiment, the composition of the second aspect comprises, consists of, or consists essentially of SPM having a vol/vol ratio of sulfuric acid component to hydrogen peroxide component in a range from about 3:1 to about 5:1 and about 5 to about 15 wt % ammonium persulfate.

In another embodiment of the composition of the second aspect, the at least one persulfate is combined with the at least one mineral acid to form a persulfate/mineral acid mixture and then said mixture is added to at least one peroxide compound such that the aforementioned percentages by weight and volume/volume ratios are achieved, as readily determined by one skilled in the art.

The compositions of the second aspect have pH less than about 2, more preferably less than about 1. It is to be appreciated that the pH of the composition of the second aspect may be less than zero, depending on the components used and the amount thereof.

In another embodiment, the compositions of the second aspect further include bulk and hardened photoresist material, wherein the bulk and hardened photoresist material may comprise boron, arsenic, boron difluoride, indium, antimony, germanium, carbon and/or phosphorous ions. For example, the composition of the second aspect may include at least one mineral acid and at least two oxidizing agents, and bulk and hardened photoresist material. In another embodiment, the composition of the second aspect may include at least one persulfate compound and a sulfuric acid/peroxide mixture, and bulk and hardened photoresist material. In yet another embodiment, the composition of the second aspect may include at least one persulfate compound, at least one mineral acid, at least one peroxide compound, and bulk and hardened photoresist material. The photoresist material and implantation ions may be dissolved and/or suspended in the low pH composition of the second aspect.

The compositions of the second aspect are compatible with underlying silicon-containing materials on the microelectronic device.

The compositions of the second aspect may be readily formulated as single-package formulations or multi-part formulations that are mixed at and/or before the point of use, e.g., the individual parts of the multi-part formulation may be mixed at the tool, in a storage tank upstream of the tool, or in a shipping package that delivers the mixed formulation directly to the tool. For example, a single shipping package may include at least two separate containers or bladders that may be mixed together by a user at the fab and the mixed formulation may be delivered directly to the tool. One of the at least two containers or bladders may include the at least one persulfate compound, which may be and preferably is a solid, while another of the at least two containers may include the sulfuric acid/peroxide mixture. In another embodiment, a single shipping package may include at least three separate containers or bladders that may be mixed together by a user at the fab and the mixed formulation may be delivered directly to the tool. One of the at least three containers or bladders may include the at least one persulfate compound, which may be and preferably is a solid, a second of the at least three containers may include the mineral acid component, e.g., sulfuric acid, while the third of the at least three containers may include the peroxide component, e.g., hydrogen peroxide. The shipping package and the internal containers or bladders of the package must be suitable for storing and shipping said composition components, for example, packaging provided by Advanced Technology Materials, Inc. (Danbury, Conn., USA).

Alternatively, a concentrate of the composition of the second aspect may be formulated and packaged in one container for shipping and for mixture with on-site components (e.g., SPM or mineral acid plus peroxide compound) prior to and/or during use, wherein said method of use is described herein. For example, the concentrate may comprise at least one persulfate compound and water, wherein the at least one persulfate compound may have a concentration less than about 50 wt, based on the total weight of the concentrate. The ratio of concentrate to on-site component(s) is readily determined by one skilled in the art knowing how much of each component is desired in the low pH composition and how much persulfate is present in the concentrate.

Another aspect relates to a kit including, in one or more containers, one or more components adapted to form the compositions of either aspect, as described herein. The containers of the kit must be suitable for storing and shipping said compositions, for example, NOWPak® containers (Advanced Technology Materials, Inc., Danbury, Conn., USA).

The one or more containers which contain the components of the compositions described herein preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

Substantially chemically inert, impurity-free, flexible and resilient polymeric film materials, such as PTFE or PTFA, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin polytetrafluoroethylene (PTFE), PFA, Halar®, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" International Application No. PCT/US08/63276 entitled "SYSTEMS AND METHODS FOR MATERIAL BLENDING AND DISTRIBUTION" filed on May 9, 2008 in the name of John E. Q. Hughes; and International Application No. PCT/US08/85826 entitled "SYSTEMS AND METHODS FOR DELIVERY OF FLUID-CONTAINING PROCESS MATERIAL COMBINATIONS" filed on Dec. 8, 2008 in the name of John E. Q. Hughes et al.

As applied to microelectronic manufacturing operations, the compositions of either aspect are usefully employed to clean bulk and hardened photoresist from the surface of the microelectronic device. The compositions do not damage low-k dielectric materials on the device surface. Preferably the compositions described herein remove at least 85% of the bulk and hardened photoresist present on the device prior to photoresist removal, more preferably at least 90%, even more preferably at least 95%, and most preferably at least 99%.

In removal application, the low pH compositions of either aspect can be applied in any suitable manner to the microelectronic device having photoresist material thereon, e.g., by spraying the low pH composition on the surface of the device, by dipping (in a volume of the low pH composition) of the device including the photoresist material, by contacting the device with another material, e.g., a pad, or fibrous sorbent applicator element, that is saturated with the low pH composition, by contacting the device including the photoresist material with a circulating low pH composition, or by any other suitable means, manner or technique, by which the low pH composition is brought into contact with the photoresist material on the microelectronic device. The application may be in a batch or single wafer apparatus, for dynamic or static cleaning.

In use of the compositions of either aspect for removing bulk and hardened photoresist from microelectronic devices having same thereon, the compositions typically are contacted with the device for a time of from about 10 sec to about 60 minutes, at temperature in a range of from about 20° C. to about 200° C., preferably about 50° C. to about 160° C. Such contacting times and temperatures are illustrative, and any other suitable time and temperature conditions may be employed that are efficacious to at least partially clean the bulk and hardened photoresist from the device. "At least partially clean" and "substantial removal" both correspond to at removal of at least 85% of the and hardened photoresist present on the device prior to photoresist removal, more preferably at least 90%, even more preferably at least 95%, and most preferred at least 99%.

Following the achievement of the desired removal action, the composition may be readily removed from the device to which it has previously been applied, as may be desired and efficacious in a given end use application of the compositions described herein. Preferably, the rinse solution for the composition of the first aspect includes cold or hot (e.g., 20-80° C.) deionized water. Preferably, the rinse solution for the composition of the second aspect includes cold or hot (e.g., 20-80° C.) deionized water. Alternatively, the rinse solution for the composition of either aspect may include a water rinse followed by a SC-1 ($H_2O_2$—$NH_4OH$—$H_2O$) rinse, whereby the device may be rinsed at or slightly above room temperature (e.g., 20-50° C.), followed by a rinse with DI water at or about room temperature. It is to be appreciated that the device may be rinsed with multiple solutions having ever decreasing concentrations of SC-1 prior to a final rinse with DI water. Thereafter, the device may be dried using nitrogen or a spin-dry cycle.

Yet another aspect relates to the improved microelectronic devices made according to the methods described herein and to products containing such microelectronic devices.

Another aspect relates to a recycled composition, wherein the composition may be recycled until loading with components of the photoresist reaches the maximum amount the composition may accommodate, as readily determined by one skilled in the art. It should be appreciated by one skilled in the art that a filtration and/or pumping system may be needed for the recycling process.

A still further aspect relates to methods of manufacturing an article comprising a microelectronic device, said method comprising contacting the microelectronic device with a composition of either aspect for sufficient time to clean bulk and hardened photoresist from the microelectronic device having said photoresist thereon, and incorporating said microelectronic device into said article, using a composition described herein.

Yet another aspect relates to a process to clean bulk and hardened photoresist from the surface of the microelectronic device using a single wafer tool (SWT) and the compositions of either aspect. Currently, solutions for the stripping of implanted resist are mostly used in batch mode and are based on strong oxidants, for example a sulfuric acid-hydrogen peroxide mixture (SPM). These mixtures have a limited bath life at the temperatures at which they are effective. With the present preference of SWTs over batch processing, there is a need to shorten the dissolution time of the photoresist from the typical 10-30 minutes to around 1 minutes Disadvantageously, this requires higher processing temperatures, for example about 40-200° C. higher than batch process temperatures, which speeds up the decomposition of the oxidizing agent(s) in the low pH compositions.

As such, higher temperature processing using SWTs is described herein. Preferably, the low pH composition for the SWTs is a single-use composition. Embodiments using the composition of the first aspect include:

1. Mixing a stream of relatively cool concentrated solution of the oxidant with a hot diluent, e.g. hot sulfuric acid. Optionally, one of the solutions may contain more water than the other, to generate some heat of mixing. The mixing may be done either in a small secondary reservoir that is just large enough for the solution needed for one wafer, or by merging two tubes carrying the two different solutions together in a "Y" connection;
2. Heating the oxidizing solution from outside the tubing while en route to the device wafer; and/or
3. Positioning the device wafer on a metal chuck with high thermal mass and controllable temperature, and relying on the heat conductivity of the wafer to quickly heat up the mineral-acid containing composition by a few tens of degrees.

Embodiments using the composition of the second aspect include:

1. Mixing a stream of relatively cool peroxide component with hot sulfuric acid component and at least one persulfate compound to yield the composition. Alternatively, mixing a stream of heated SPM with at least one persulfate compound to yield the composition. In yet another alternative, mixing a stream of sulfuric acid component and at least one persulfate compound to form a sulfuric acid/persulfate mixture and then mixing a stream of said mixture with a stream of relatively cool peroxide component to yield the composition. Optionally, one of the solutions may contain more water than the other, to generate some heat of mixing. The mixing may be done either in a small secondary reservoir that is just large enough for the solution needed for one wafer, or by merging two tubes carrying the two different solutions together in a "Y" connection;
2. Heating the persulfate-containing composition from outside the tubing while en route to the device wafer; and/or
3. Positioning the device wafer on a metal chuck with high thermal mass and controllable temperature, and relying on the heat conductivity of the wafer to quickly heat up the persulfate-containing composition by a few tens of degrees.

The features and advantages of the invention are more fully shown by the illustrative examples discussed below.

Example 1

It has been found that mixtures of sulfuric acid and periodic acid, at concentrations of 5-15% periodic acid, are effective at removing high-density implanted resist at temperatures between 60 and 95° C. and reaction times of 30-60 minutes, depending on type of implant, dose and energy. For example, solutions of 4.75 wt % and 9.1 wt. % periodic acid in concentrated sulfuric acid cleaned a test pattern of implanted resist (As, $2\times10^{15}$ atoms $cm^{-2}$, 20 keV) in 30 minutes at 60° C. The process tolerates a small amount of water, e.g. 2 g PIA, 1 g water, and 19 g concentrated (~96%) sulfuric acid, and efficaciously removed the implanted resist.

At 80° C., solutions having both 5% and 10% periodic acid in concentrated sulfuric acid completely cleaned a test wafer implanted at $5\times10^{15}$ atoms $cm^{-2}$ As at 20 keV and $1\times10^{15}$ atoms $cm^{-2}$ As at 40 keV in 30 minutes. These solutions could partially clean a wafer implanted with $1\times10^{16}$ atoms $cm^{-2}$ As at 20 keV but not completely.

Example 2

The stability of the solutions described herein was tested. A large batch of a 10% periodic acid in concentrated sulfuric acid solution was prepared, separated into 22 different containers and heated to 80° C. These solutions were tested at various intervals for cleaning ability using $2\times10^{15}$ atoms $cm^{-2}$ As 20 keV wafers. At 92 h of heating the solution still looked and cleaned the same as the initial solution. At 140 h of heating a yellow precipitate had formed and the testing was stopped.

A separate experiment was performed to examine the shelf life of the solution. As of day 68 the solution was still cleaning a $2\times10^{15}$ atoms $cm^{-2}$ As 20 keV wafer at 60° C. completely after 30 mins.

Example 3

A series of experiments were performed using a batch of wafers developed using a proprietary mask wherein said wafers included UV 110 G positive 248 nm resist and combined ion-implants. Resist lines typical of 90 nm node patterns and slightly beyond, down to 225 nm width and 400 nm pitch, could be removed by treatment with a 5% periodic acid in concentrated sulfuric mix, at 90° C. after 30 min. In the case of heavier implants (e.g., $4\times10^{15}$ atoms $cm^{-2}$ $BF_2^+$ and $3.5\times10^{15}$ atoms $cm^{-2}$ As), significant resist residues were redeposited on the wafer. To minimize said redeposition, a better mode of operation, including vertical positioning of the wafer, and better and more vigorous rinsing including a dilute SC-1 rinse, may be employed.

Example 4

The addition of potassium permanganate to the 5% periodic acid-concentrated sulfuric acid mixture in order to speed up the reaction was examined. The concentrations of KMnO4 added were 49, 220, and 1000 ppm, and the test samples implanted with $1\times10^{16}$ atoms $cm^{-2}$ As at 20 keV. While complete cleaning was not achieved, the 220 ppm $KMnO_4$ solution showed a distinct advantage over the others and over a solution containing no added permanganate.

Example 5

To determine whether periodic acid and $KMnO_4$ pose a wafer contamination risk, blanket silicon wafers were treated for 30 min at 90° C. in (a) a 5% periodic acid-concentrated sulfuric mix or (b) the formulation in (a) plus 220 ppm added $KMnO_4$. The wafers were then rinsed in water, or in water+dilute SC-1+water, and examined by Total Reflection X-ray Fluorescence Spectroscopy (TXRF). The only contaminant found on the silicon wafer was sulfur (from sulfuric acid), which can be removed by SC-1 treatment. Iodine, potassium and manganese do not seem to pose a problem under the given conditions.

Since permanganate does not appear to contaminate the wafer significantly, a solution of 0.2% $KMnO_4$ in concentrated sulfuric acid was tested on the same proprietary wafers mentioned in Example 3. After 30 min at 90° C., complete cleaning of the relevant 90 nm node lines was observed for 15 keV, $3.5\times10^{15}$ atoms $cm^{-2}$ As implant, but not for 40 keV, $1\times10^{16}$ atoms $cm^{-2}$ As.

Example 6

A series of experiments were performed using a batch of wafers developed using a proprietary mask wherein said wafers included positive 248 nm resist and combined ion-implants ($3\times10^{14}$ atoms $cm^{-2}$ Ge at 15 KeV and $3.5\times10^{15}$ atoms $cm^{-2}$ As at 15 KeV). The proprietary wafers were immersed in Formulations A-C, as described below, at 60° C. for 30 minutes, rinsed, and optical micrographs obtained.

Formulation A: 1 wt % ammonium persulfate, 99 wt % SPM having a 4:1 v/v ratio

Formulation B: 5 wt % ammonium persulfate, 95 wt % SPM having a 4:1 v/v ratio

Formulation C: 15 wt % ammonium persulfate, 85 wt % SPM having a 4:1 v/v ratio

It was determined that formulations B and C in particular substantially removed the resist from the surface of the wafer with minimal redeposition of resist particles.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A method of removing bulk and/or hardened photoresist material from a microelectronic device having said photoresist material thereon, said method comprising contacting the microelectronic device with a low pH composition for sufficient time and under sufficient contacting conditions to at least partially remove said photoresist material from the microelectronic device, wherein the low pH composition comprises at least one persulfate compound and at least one peroxide compound.

2. A method of removing bulk and/or hardened photoresist material from a microelectronic device having said photoresist material thereon, said method comprising contacting the microelectronic device with a low pH composition for sufficient time and under sufficient contacting conditions to at least partially remove said photoresist material from the microelectronic device, wherein the low pH composition comprises at least one mineral acid and at least one oxidizing agent, wherein the oxidizing agent comprises at least one iodine-containing oxidizing agent, at least one metal ion-containing oxidizing agent comprising a permanganate ion, or a combination of at least one iodine-containing oxidizing agent and at least one metal ion-containing oxidizing agent comprising a permanganate ion.

3. The method of claim 2, wherein the low pH composition comprises sulfuric acid and periodic acid.

4. The method of claim 2, wherein the low pH composition comprises sulfuric acid and potassium permanganate.

5. The method of claim 4, wherein the composition further comprises periodic acid.

6. The method of claim 2, wherein the at least one iodine-containing oxidizing agent comprises a species selected from the group consisting of periodic acid, salts of periodic acid, iodic acid and salts thereof, iodine, and combinations thereof.

7. The method of claim 2, wherein the at least one iodine-containing oxidizing agent comprises a species selected from the group consisting of metaperiodic acid, orthoperiodic acid, sodium periodate, potassium periodate, ammonium periodate, calcium periodate, sodium iodate, potassium iodate, calcium iodate, iodine, and combinations thereof.

8. The method of claim 2, wherein the at least one metal ion-containing oxidizing agent comprises a species selected from the group consisting of potassium permanganate, cesium permanganate, sodium permanganate, ammonium permanganate, tetrabutylammonium permanganate and combinations thereof.

9. The method of claim 2, wherein the at least one mineral acid comprises concentrated sulfuric acid, concentrated phosphoric acid, or a combination of concentrated sulfuric acid and concentrated phosphoric acid.

10. The method of claim 2, wherein the composition is substantially devoid of at least one of abrasive material, hydrogen peroxide, hydrofluoric acid, fluoride ions, cations such as imidazolium, pyridinium, pyrrolidinium, ammonium and phosphonium, polymeric polishing accelerating agents having a hydrocarbon backbone, and combinations thereof.

11. The method of claim 1, wherein the at least one persulfate compound comprises an acid selected from the group consisting of ammonium peroxydisulfate, sodium peroxydisulfate, potassium peroxydisulfate, cesium peroxydisulfate, tetramethylammonium peroxydisulfate, tetraethylammonium peroxydisulfate, pyridinium peroxydisulfate, imidazolium peroxydisulfate, benzyltrimethylammonium peroxydisulfate, peroxydisulfuric acid, and combinations thereof.

12. The method of claim 1, wherein the at least one peroxide compound comprises hydrogen peroxide, hydrogen peroxide—urea adduct, or a combination thereof.

13. The method of claim 1, wherein the composition is substantially devoid of at least one of abrasive material, wetting agents, tungsten, copper ions or copper-containing residue, phosphate salts, potassium sulfate, fluoride ions, components that will result in the formation of a resinous material, and combinations thereof.

14. The method of claim 2, wherein the at least one mineral acid comprises an acid selected from the group consisting of sulfuric acid, methanesulfonic acid, trifluoromethane sulfonic acid, perchloric acid, trifluoroacetic acid, nitric acid, pyrosulfuric acid, pyrophosphoric acid, polymetaphosphoric acid, phosphoric acid, ammonium hydrogen sulfate, and combinations thereof.

15. The method of claim 2, wherein the at least one mineral acid comprises sulfuric acid.

16. The method of claim 15, wherein the sulfuric acid is 95 to 98 wt % concentrated.

17. The method of claim 1, wherein the pH of the composition is less than 2.

18. The method of claim 1, wherein the composition further comprises bulk and/or hardened photoresist material residue.

19. The method of claim 18, wherein the hardened photoresist material residue includes at least one implanted ion selected from the group consisting of B, As, P, $BF_2^+$, C, In, Ge, Sb, and combinations thereof.

20. The method of claim 1, wherein said contacting comprises at least one condition selected from the group consisting of: time from about 1 minute to about 60 minutes; temperature from about 20° C. to about 200° C.; and combinations thereof.

21. The method of claim 1, wherein the contacting occurs using a single wafer tool.

22. The method of claim 2, wherein the pH of the composition is less than 2.

23. The method of claim 2, wherein the composition further comprises bulk and/or hardened photoresist material residue.

24. The method of claim 1, wherein the at least one persulfate compound comprises ammonium peroxydisulfate.

25. The method of claim 1, wherein the at least one peroxide compound comprises hydrogen peroxide.

26. The method of claim 1, further comprising mineral acid selected from the group consisting of sulfuric acid, methanesulfonic acid, trifluoromethane sulfonic acid, perchloric acid, trifluoroacetic acid, nitric acid, pyrosulfuric acid ($H_2S_2O_7$), pyrophosphoric acid, polymetaphosphoric acid, phosphoric acid, and combinations thereof.

* * * * *